United States Patent [19]

Gerson et al.

[11] Patent Number: 5,642,368

[45] Date of Patent: Jun. 24, 1997

[54] ERROR PROTECTION FOR MULTIMODE SPEECH CODERS

[75] Inventors: Ira Alan Gerson, Hoffman Estates; Eric Helmut Winter, Oak Park; Mark Antoni Jasiuk, Chicago, all of Ill.

[73] Assignee: Motorola, Inc., Schaumburg, Ill.

[21] Appl. No.: 541,738

[22] Filed: Oct. 11, 1995

Related U.S. Application Data

[63] Continuation of Ser. No. 214,061, Mar. 16, 1994, abandoned, which is a continuation of Ser. No. 755,241, Sep. 5, 1991, abandoned.

[51] Int. Cl.$^6$ ............................. G06F 11/10; H03M 13/12
[52] U.S. Cl. ............................. 371/43; 395/2.09
[58] Field of Search ............................. 371/37.1, 43, 2.1; 381/36, 46; 395/2.09, 2.17, 2.23, 2.28, 2.42

[56] References Cited

U.S. PATENT DOCUMENTS

| | | | |
|---|---|---|---|
| 4,802,171 | 1/1989 | Rasky | 371/43 |
| 4,831,624 | 5/1989 | McLaughlin et al. | 381/46 |
| 5,070,503 | 12/1991 | Shikakura | 371/37.1 |
| 5,073,940 | 12/1991 | Zinser | 381/47 |
| 5,097,507 | 3/1992 | Zinser et al. | 381/31 |
| 5,247,579 | 9/1993 | Hardwick | 381/40 |
| 5,251,261 | 10/1993 | Meyer | 381/36 |
| 5,255,339 | 10/1993 | Fette | 395/2 |

*Primary Examiner*—Glenn Snyder
*Attorney, Agent, or Firm*—John G. Rauch; Kirk W. Dailey

[57] ABSTRACT

A method for protecting information bits wherein input data bits, at least some of which are to be protected, are sorted based upon information determined from a subset of the input data bits. An error control coding technique is applied to at least some of the sorted bits. In the preferred embodiment, an input data stream of voice coder bits is separated into arrays of bits. A first array (302) comprises voice coder bits needing error protection, with the bits arranged in order of importance determined by voicing mode. The second array (303) comprises bits that will not be error protected. The bits from the first array are provided to the input of an encoder (304), then the encoded bits are combined (305) with the bits from the second array (303) to form a bit stream.

8 Claims, 4 Drawing Sheets

5,642,368

ERROR PROTECTION FOR MULTIMODE SPEECH CODERS

This is a continuation of application Ser. No. 08/214,061, filed Mar. 16, 1994, abandoned, which is a continuation of Ser. No. 07/755,241, filed Sep. 5, 1991, abandoned.

TECHNICAL FIELD

This invention relates generally to digital data transmission and in particular to speech coders, and is more particularly directed toward a method for providing error protection for appropriate bits.

BACKGROUND OF THE INVENTION

Two-way radio communication of voice signals is an essential capability for modern society. Organizations involved in police work, public safety, and transportation are major users of voice communication, to say nothing of military users. With increasing demands being placed upon available radio frequency spectrum, much research has been done on maximizing spectrum efficiency.

One way to increase spectrum efficiency is to compress speech signals prior to transmission. This compression operation, as is well-known in the art, reduces bandwidth requirements for the transmission of voice signals and permits the assignment of more RF (radio frequency) communication channels within a given range of frequencies. Similarly, speech compression algorithms may also be applied to digital speech storage.

With the increasing emphasis on digital communication, compression schemes peculiar to digital systems have received much attention. Compression schemes dedicated to digitized speech are commonly referred to as voice coders. U.S. Pat. No. 4,933,957 to Bottau et al. describes a low bit rate voice coding method and system exemplary of those commonly known in the art.

Linear predictive coding, or LPC, is an example of a popular voice coding technique. In LPC, an attempt is made to approximate human speech by deriving appropriate models for both the human vocal tract and for excitations applied to the vocal tract. Since speech is a very repetitive type of signal, the amount of information required to allow a decoder to accurately reproduce a speech waveform can be much reduced. Depending upon the nature of the speech being transmitted, some bits may be more perceptually significant to the reconstructed speech than others.

As with any type of digital signal, decisions must be made at the decoder regarding whether a logic "1" level or a logic "0" level was originally transmitted. Error control coding, a concept well-understood in the art, is often employed to increase the likelihood that the decoder will make correct decisions. Of course, it is self-defeating to compress digital speech for transmission only to add a large number of error control bits. A compromise must be reached in order to maximize the effectiveness of a given speech compression algorithm while trying to ensure speech quality by guaranteeing error-free reception of critical bits. Of course, critical bits can be identified for a variety of data transmission scenarios that do not involve speech coding applications.

Accordingly, a need arises for a method for error protecting critical bits for transmission, where the specific bits requiring protection may be dependent upon a subset of input bits such as, for example, the set of bits identifying the type of speech waveform being coded. The specific bits requiring protection could also be determined by expected communication channel conditions.

SUMMARY OF THE INVENTION

This need and others are satisfied by the method of the present invention for error protecting information bits The method comprises providing input data bits, at least some of which are to be protected, sorting the input data bits based upon information determined from a subset of the input data bits, and applying an error control coding technique to at least some of the sorted bits.

DESCRIPTION OF A PREFERRED EMBODIMENT

Figure 1:
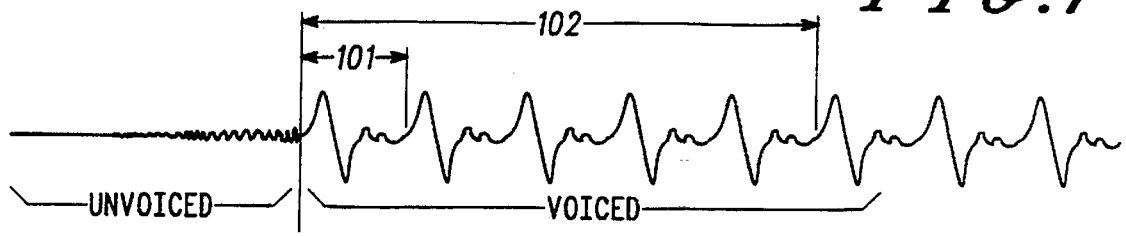
FIG. 1 is an illustration of a typical speech waveform.

FIG. 1 illustrates a typical speech waveform. Human speech may be generally classified as either "voiced" or "unvoiced." In voiced speech, a perceptible, periodic, excitation is applied to the vocal tract. Voiced speech is commonly associated with vocalization of long vowel sounds, such as the long "a," "i," and "o" sounds in the word "radio." Consonant sounds not involving substantial periodic excitation are considered unvoiced.

FIG. 1 is also illustrative of the fact that voiced speech exhibits observable periodicities. There are long-term periodicities, such as those seen in segment 102, and short term correlations like those of segment 101. From a standpoint of probabilistic analysis, these tendencies for speech waveform characteristics to exhibit themselves result in relatively high short-term and long-term correlations that make linear prediction a viable voice coding concept. The relationship between these correlations and LPC techniques will be discussed in more detail below.

Figure 2A:
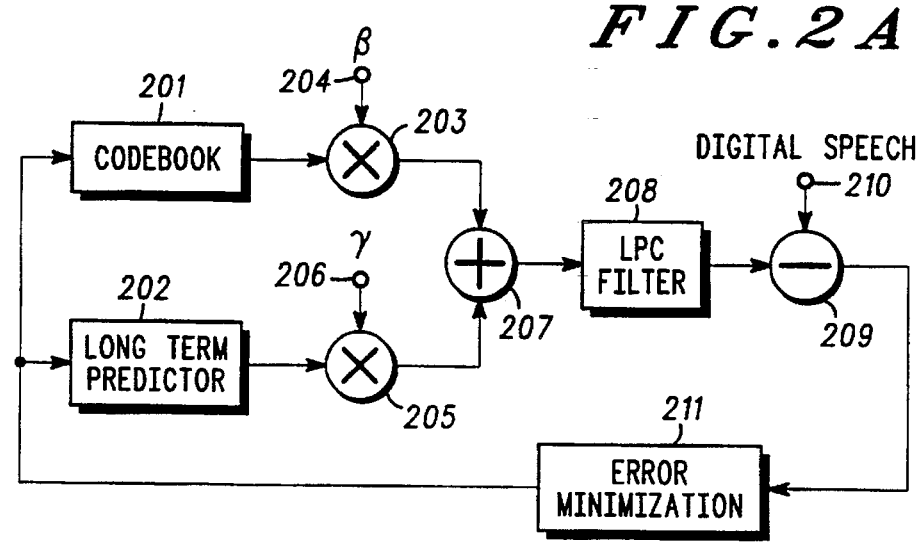
FIG. 2A is a block diagram of a VSELP speech coder.

FIG. 2A depicts, in block diagram form, a vectorsum excited linear prediction (VSELP) voice coder. Speech signals, even when they can be characterized as voiced, exhibit stochastic (random) properties as well as periodic properties. In a VSELP system, vocal tract excitation is modeled by a combination of a first waveform vector selected from a fixed set of excitation vectors called a codebook (201), and a second vector selected by extracting a portion of a waveform based upon the past history of the speech being coded. This past history is stored in a long term predictor memory (202).

Long-term predictor (202) information is especially useful in coding voiced speech, where long-term correlations are predominant. Codebook-derived vectors (201) help in coding speech waveforms that are either voiced or unvoiced. In order to accommodate speech waveforms with varying degrees of voiced characteristic, both codebook vectors (201) and long term predictor vectors (202) are scaled by applying multiplicative gain factors (204 and 205, respectively).

These scaled vectors are summed (207) and the resulting excitation is applied to an LPC filter (208). In the preferred embodiment, the LPC filter is an IIR (infinite impulse response) filter implemented in a DSP (digital signal processor). The LPC filter (208) is primarily intended to model the vocal tract to which the excitation is applied. Reprogramming of LPC filter (208) coefficients may be effected periodically to optimize the speech coder output. In fact, the speech coder output is compared (209) with digitized speech (210) and the resulting error is minimized (211) by altering vector selection from both the codebook (201) and the long-term predictor (202).

In the preferred embodiment, the speech coder operates at 5.9 kilobits per second (kbps) with a frame length of 20 milliseconds (ms). The length of the frames or packets approximates the period of speech over which at least some parameters normally remain relatively constant. Examples of these relatively constant parameters include LPC filter coefficients and voicing mode. In the preferred embodiment, the voicing modes are unvoiced, slightly voiced, moderately voiced, and strongly voiced. The 20 ms frame is divided into four 5 ms subframes to accommodate parameters that change more frequently in speech waveforms. These more volatile parameters include excitation vector information and multiplicative gain values.

In actual practice, a frame contains 118 information bits. But, as discussed previously, not all bits are of equal importance. The long-term predictor vector adds little to the coding of unvoiced speech, but it is very important to proper speech waveform reconstruction in the strongly voiced voicing mode. Because of this variation in significance, the present invention permits speech coder bits to be selectively error protected based upon voicing mode, thus achieving the needed compromise between desirable error control coding of information bits and unwanted bandwidth expansion that would result from the addition of too many overhead bits.

Figure 2B:
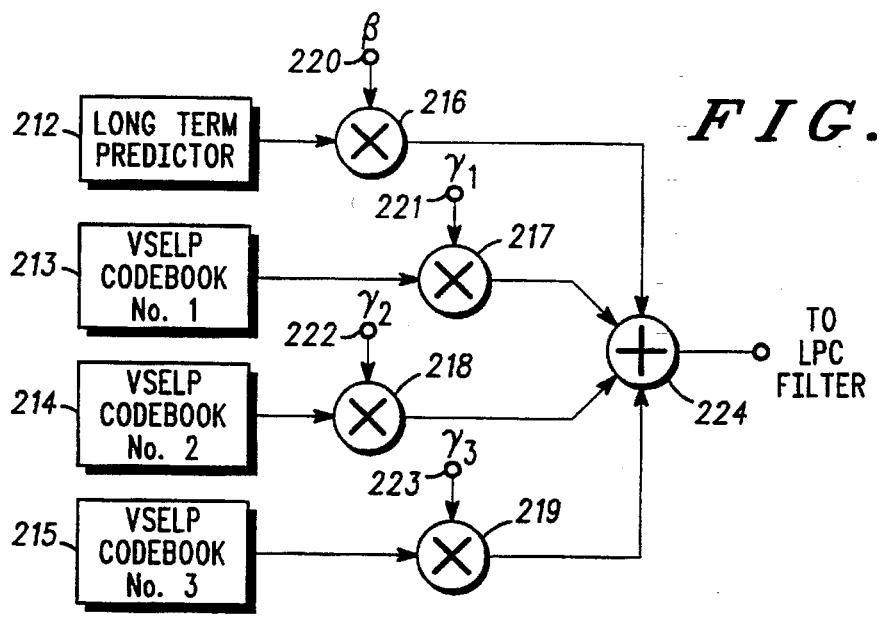
FIG. 2B illustrates, in more detail, VSELP codebooks used in the preferred embodiment.

FIG. 2B shows the various codebooks of the preferred embodiment in more detail. As discussed previously, the long term predictor vector adds little to the coding of unvoiced speech. Thus, for unvoiced mode, vectors from two VSELP codebooks (214 and 215) are selected instead. If the speech waveform being voice coded is slightly, moderately, or strongly voiced, the important long term predictor (212) vector is transmitted along with a single vector from a VSELP codebook (213). Of course, just as in the simpler example used above, each vector has an associated multiplicative gain value (220 through 223) applied to an appropriate multiplier (216 through 219) to adjust the amplitudes for optimum speech coding. Just as before, after the selected vectors are summed (224), they are applied to an LPC filter.

In the preferred embodiment, convolutional coding is used to afford error protection. Convolutional encoders and decoders are well-known in the art, and are also very easy to implement, particularly with the power of a DSP at the designer's disposal. Of course, this does not obviate the use of well-known block encoders, or even a combination of the two, to provide the necessary error protection.

Figure 3:
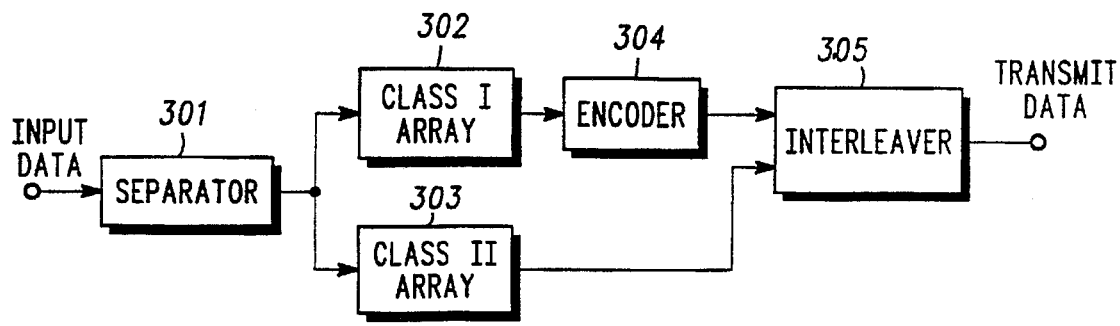
FIG. 3 is a block diagram of an encoder system that may be used to implement the method of the present invention.

FIG. 3 shows, in block diagram form, the encoder system of the present invention. The 118 bits of frame data are applied to the input of a data separator (301). Based on the voicing mode, the data separator (301) places the bits that are considered most important for that particular voicing mode in a memory array called the Class I array (302). The important bits assigned to the Class I array (302) are arranged in order from most important to least important.

The data bits that are not considered important for the particular voicing mode are placed in a memory array designated the Class II array (303). These bits will not be subject to error control coding.

Figure 4:
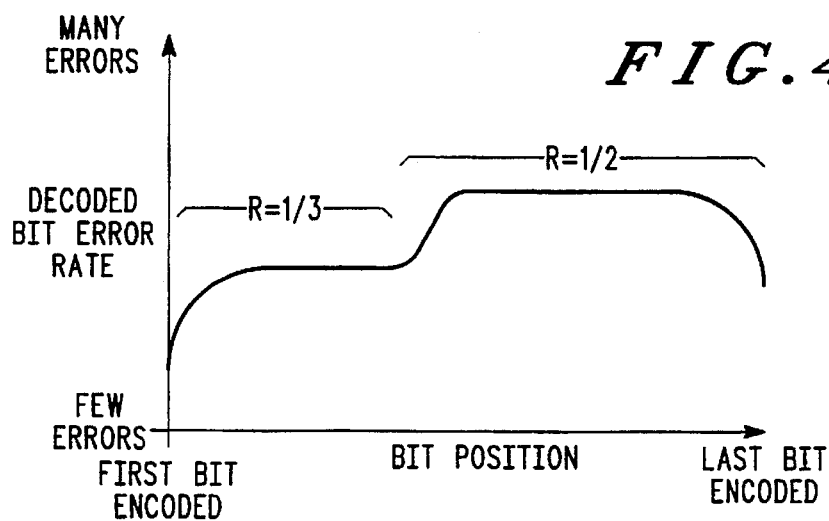
FIG. 4 is a graph of decoded bit error rate versus bit position for a variable rate convolutional encoder.

The bits from the Class I array (302) are input to a convolutional encoder (304). The encoder (304) of the preferred embodiment is switchable from a rate ⅓ encoder to a rate ½ encoder. This is often termed a multirate encoder. As is well-known in the art, data that is encoded using a rate ⅓ convolutional code will have a lower decoded bit error rate than data encoded with a rate ½ code. Of course, the lower bit error rate is accomplished at the expense of more overhead bits. FIG. 4 illustrates a well-known peculiarity of convolutional codes. The best recovered bit error rate occurs for bits that are either near the first bit to be encoded or the last bit to be encoded. Since the early bits are the best protected, the voicing mode bits are placed in this position.

Figure 5:
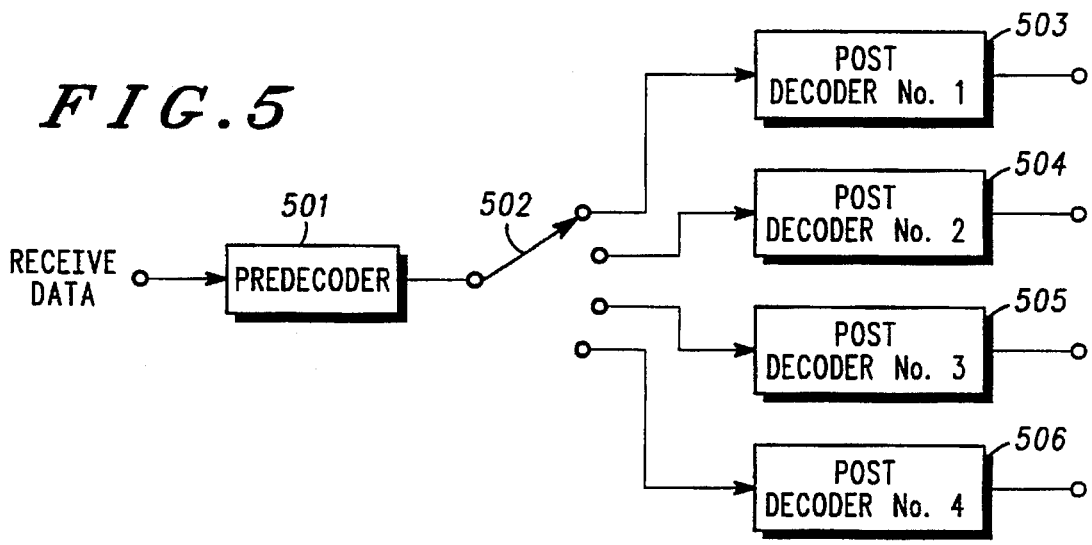
FIG. 5 shows the use of a pre-decoder to select the appropriate post-decoder.

Since the voicing mode bits are preferably always in the same position, and encoded in the same way, a single pre-decoder (501), as illustrated in FIG. 5, can be used to decode these bits. The resulting decoded mode information can be used to select (502) the appropriate post-decoder (503 through 506) in order to ensure that the appropriate mode-determined ordering and encoding algorithm is used to decode the protected voice coder data bits.

In digital transmission systems, some transmitted bits have a higher probability of decoded error than other bits, principally because of their position in the channel. For example, in TDM (time-division multiplex) systems, probability of decoded error of a particular bit may be related to the bit's proximity to a transmitted synchronization sequence.

Returning to FIG. 3, the output of the encoder (304) is applied to the input of an interleaver (305), as is the output of the Class II array (303). The interleaver (305) simply combines the encoded and unencoded bits so that the resultant data stream can be transmitted.

Figure 6:
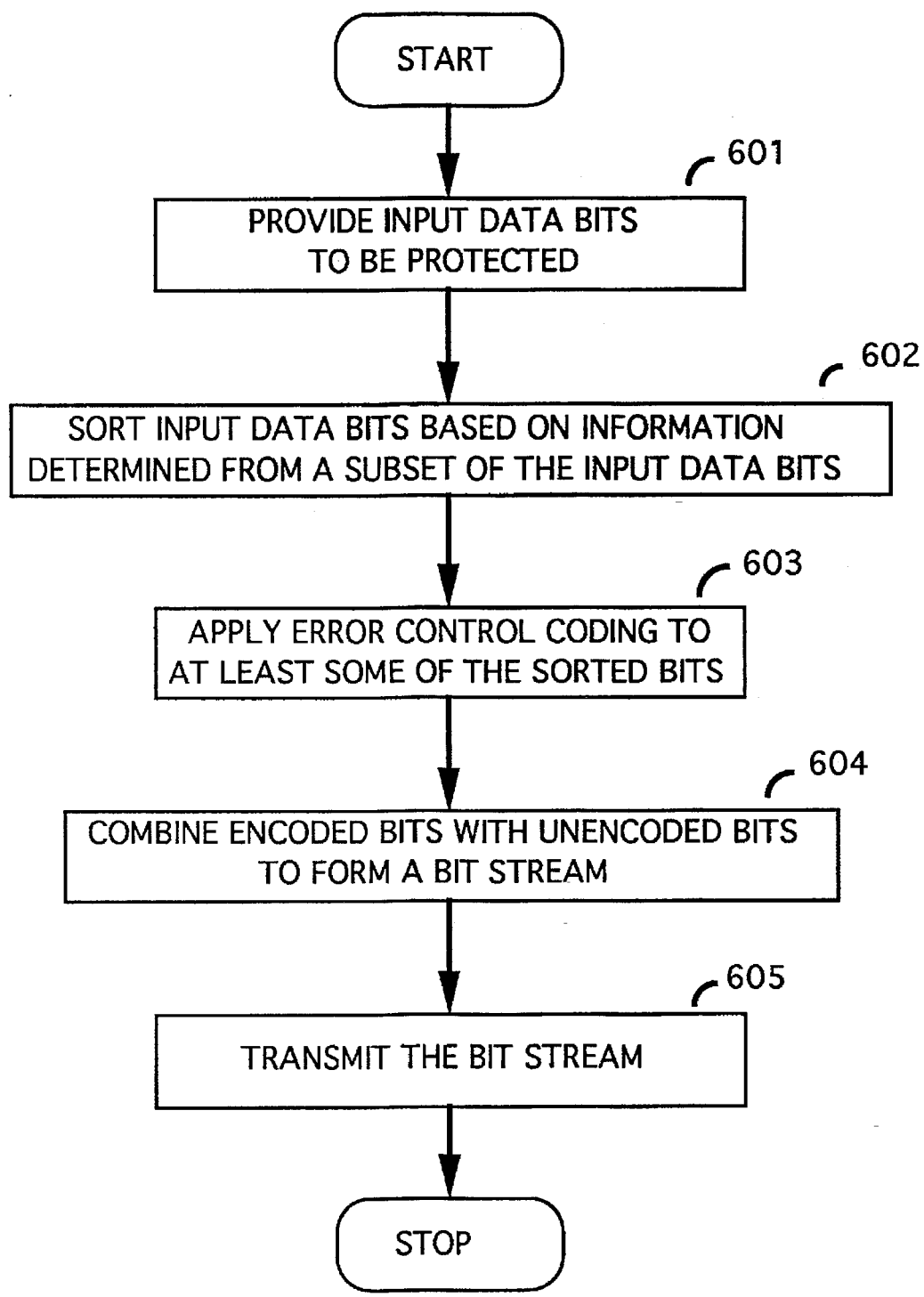
FIG. 6 illustrates pertinent method steps of the present invention in the form of a flowchart.

FIG. 6 is a flowchart representation of the method of the present invention. After a START state, input data bits to be protected are provided in block 601. In the next step (602), the input data bits are sorted based on information determined from a subset of the input data bits. In the preferred embodiment, input data bits are separated into first and second arrays, based upon voicing mode information contained in the input data bits. Next, in block 603, error control coding is applied to the sorted bits in the first array, with the bits in the second array left unencoded.

The sorting operation of block 602 above also provides arrangement of bits based upon perceptual significance, so these significant bits can be encoded in such a way as to minimize the probability of decoded error. Preferably, convolutional coding is used for error control, but block coding or a combination of the two is also contemplated by the invention. Following error control coding, the encoded bits are combined with the unencoded bits to form a bit stream (604), then, in the final operative step (605), the bit stream is transmitted.

Figure 7:
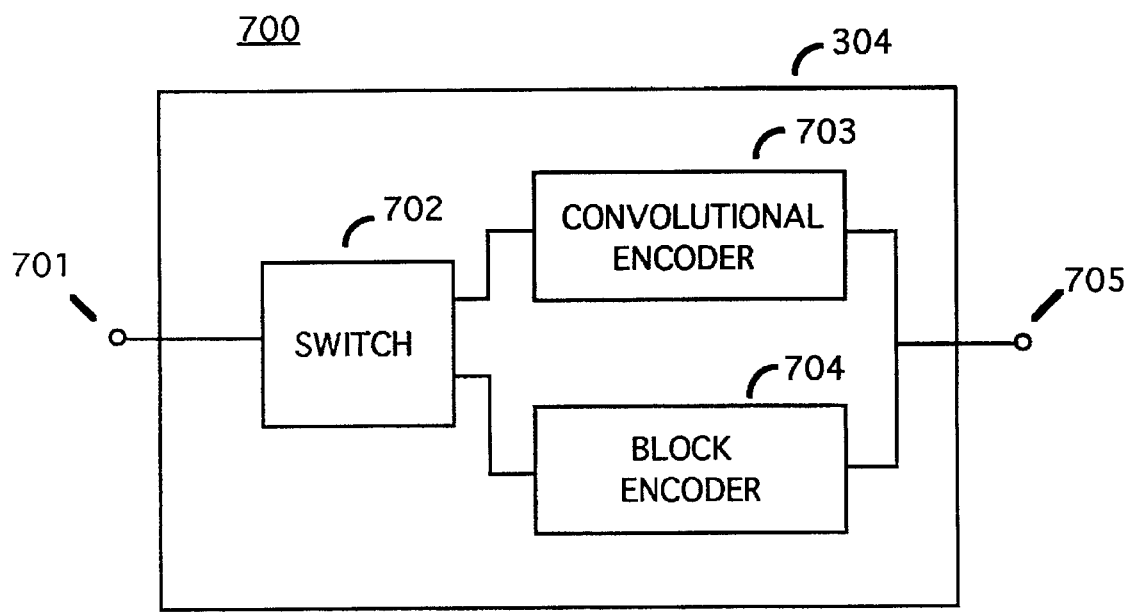
FIG. 7 is a block diagram depicting the use of multiple encoders.

FIG. 7 illustrates the combination of encoders alluded to above, generally depicted by the numeral 700. The encoder (304) of FIG. 3 is shown with an input (701) to which bits of the Class I Array (302) are applied. Within the encoder (304), a switch (702) controls application of the input bits to either a convolutional encoder (703) or a block encoder (704), in such a configuration that either or both encoders may be employed. The encoded bits are then available at the encoder output (705).

What is claimed is:

1. A speech coder for producing coded speech, the speech being one of voiced speech and unvoiced speech, the speech coder comprising:

a linear predictive coding (LPC) filter having an input for receiving an excitation and an output for providing a speech approximation signal, the speech approximation signal including data bits representative of voiced speech;

a comparator having an input coupled to the LPC filter output for receiving the speech approximation signal and an output, the comparator comparing the speech approximation signal with digitized speech and providing an error signal representative of the difference between the digitized speech and the speech approximation signal to the output;

a long-term predictor having an input coupled to the comparator and an output, the long term predictor providing a long term predictor vector at the output in response to the error signal received at the input only when the speech is voiced speech;

one or more codebooks, each having a respective input and a respective output for providing a respective codebook vector, the one or more codebooks providing one respective codebook vector from one codebook of the one or more codebooks in response to the error signal when the speech is voiced speech, the one or more codebooks providing more than one codebook vector from more than one respective codebooks in response to the error signal when the speech is unvoiced speech;

a summer having a plurality of inputs coupled to the long-term predictor output and the respective outputs of the codebooks, the summer summing the long-term predictor vector and the respective codebook vectors to produce the excitation, the summer having an output coupled to the input of the LPC filter for providing the excitation to the LPC filter;

an encoder circuit coupled to the output of the LPC filter for receiving the speech approximation signal, the encoder circuit including:

a data separator having an input for receiving the speech approximation signal and an output, the data separator separating the data bits representative of voiced speech into more important bits and less important bits in response to the speech being voiced speech;

a first memory having an input coupled to the output of the data separator for receiving the more important bits and an output, the first memory storing the more important bits;

a second memory having an input coupled to the output of the data separator for receiving the less important bits and an output, the second memory storing the less important bits;

a convolutional encoder having an input coupled to the output of the first memory and an output, the convolutional encoder encoding the more important bits to produce encoded data bits at the output; and an interleaver having a first input coupled to the output of the convolutional encoder for receiving the encoded data bits, a second input coupled to the output of the second memory for receiving the less important bits and an output, the interleaver combining the encoded data bits and the less important data bits to produce the coded speech.

2. A speech coding system as defined in claim 1 wherein the encoder comprises a multirate convolutional encoder.

3. A speech coding system as defined in claim 1 wherein the encoder comprises a convolutional encoder variable from a rate ⅓ encoder to a rate ½ encoder.

4. A speech coding system as defined in claim 1 wherein the most important bits comprise bits defining the voicing mode of the speech.

5. A speech coding system as defined in claim 4 wherein the encoder encodes the most important data bits serially, starting with a first bit to be encoded and ending with a last bit to be encoded, and wherein the bits defining the voicing mode are encoded near the first bit to be encoded.

6. A method for producing coded speech, the speech being one of voiced speech and unvoiced speech, the method comprising the steps of:

producing a speech approximation signal, the speech approximation signal including data bits representative of voiced speech;

comparing the speech approximation signal with digitized speech and providing an error signal representative of the difference between the digitized speech and the speech approximation signal;

providing a long term predictor vector in response to the error signal only when the speech is voiced speech;

selecting a codebook vector from a codebook in response to the error signal when the speech is voiced speech, and selecting more than one codebook vector in response to the error signal when the speech is unvoiced speech;

separating the data bits representative of voiced speech into more important bits and less important bits when the speech is voiced speech;

storing the more important bits in a first memory;

storing the less important bits in a second memory;

encoding the more important bits to produce encoded data bits; and combining the encoded data bits and the less important data bits to produce the coded speech.

7. A method as recited in claim 6 further comprising the step of summing the long term predictor vector and the codebook vector, producing an excitation, wherein the speech approximation signal is produced responsive to the excitation.

8. A method as recited in claim 6 wherein the step of encoding comprises the steps of encoding the most important data bits serially, starting with a first bit to be encoded and ending with a last bit to be encoded, and encoding bits defining the voicing mode near the first bit to be encoded.

* * * * *